(12) United States Patent
Ricks et al.

(10) Patent No.: US 7,120,657 B2
(45) Date of Patent: Oct. 10, 2006

(54) SYSTEM AND METHOD FOR ADAPTIVE FILTERING

(75) Inventors: David Charles Ricks, Arlington, VA (US); Jay Scott Goldstein, Centreville, VA (US)

(73) Assignee: Science Applications International Corporation, San Diego, CA (US)

( * ) Notice: Subject to any disclaimer, the term of this patent is extended or adjusted under 35 U.S.C. 154(b) by 706 days.

(21) Appl. No.: 09/933,004

(22) Filed: Aug. 21, 2001

(65) Prior Publication Data

US 2002/0152253 A1    Oct. 17, 2002

Related U.S. Application Data

(60) Provisional application No. 60/243,480, filed on Oct. 27, 2000, provisional application No. 60/228,408, filed on Aug. 29, 2000.

(51) Int. Cl.
*G06F 17/10* (2006.01)
(52) U.S. Cl. ...................................................... 708/322
(58) Field of Classification Search ................ 708/300, 708/322, 422, 490; 382/128, 134, 178, 195–198, 382/253
See application file for complete search history.

(56) References Cited

U.S. PATENT DOCUMENTS 3,892,051 A * 7/1975 Bunker ........................ 434/43
4,259,661 A * 3/1981 Todd ........................... 382/205
5,151,919 A * 9/1992 Dent ........................... 370/209
5,285,291 A * 2/1994 Schiller ....................... 358/453
6,122,628 A * 9/2000 Castelli et al. ................. 707/5
6,341,298 B1 * 1/2002 Ilani ........................... 708/520

OTHER PUBLICATIONS

International Preliminary Examination Report for Application No. PCT/US01/26592, dated Jun. 14, 2002 (mailing date).

(Continued)

*Primary Examiner*—Tan V. Mai
(74) *Attorney, Agent, or Firm*—Kilpatrick Stockton LLP

(57) ABSTRACT

A method for analyzing data, the data characterized by a set of scalars and a set of vectors, to analyze the data into components related by statistical correlations. In preferred embodiments, the invention includes steps or devices for, receiving a set of a scalars and a set of vectors as the inputs; calculating a correlation direction vector associated with the scalar and vector inputs; calculating the inner products of the input vectors with the correlation direction vector; multiplying the inner products onto the correlation direction vector to form a set of scaled correlation direction vectors; and subtracting the scaled correlation direction vectors from the input vectors to find the projections of the input vectors orthogonal to the correlation direction vector. The outputs are the set of scalar inner products and the set of vectors orthogonal to the correlation vector. The steps or devices can be repeated in cascade to form a multi-stage analysis of the data. The invention can also be used with a steering vector preceding the adaptive analysis stages.

4 Claims, 5 Drawing Sheets

$$d_i(k) = \mathbf{h}_i^H \mathbf{x}_{i-1}(k)$$
$$\mathbf{x}_i(k) = \mathbf{x}_{i-1}(k) - \mathbf{h}_i d_i(k)$$
$$\varepsilon_{i-1}(k) = d_{i-1}(k) - w_i\, \varepsilon_i(k)$$

OTHER PUBLICATIONS

International Search Report for Application No. PCT/US01/26592, dated Nov. 26, 2001 (mailing date).

S. Haykin, Adaptive Filter Theory, 3rd edition, esp. pp. 194,483, Prentice Hall, 1996.

Bernard Widrow and Samuel Stearns, Adaptive Signal Processing, Prentice Hall, 1985.

G.H. Golub and C.F. Van Loan, Matrix Computations, 3rd edition, Johns Hopkins University Press, (esp. pp. 18-19), with examples tabulated on pp. 254, 263, and 270, 1996.

Harold Abelson and Gerald Sussman, Structure and Interpretation of Computer Programs, MIT Press and McGraw Hill, pp. 39-40.

J.S. Goldstein, I.S. Reed, and L.L. Scarf, A multistage representation of the Wiener filter based on orthogonal projections, IEEE Transactions on Information Theory, vol. 44, No. 7, pp. 2943-2959, Nov. 1998.

D.C. Ricks, and J.S. Goldstein, "Efficient architectures for implementing adaptive algorithms," Proceedings of the 2000 Antenna Applications Symposium, pp. 29-41, Allerton Park, Monticello, Illinois, Sept. 20-22, 2000.

* cited by examiner

SYSTEM AND METHOD FOR ADAPTIVE FILTERING

CROSS REFERENCES TO RELATED APPLICATIONS

The present application relates to and claims priority to applicant's co-pending applications 60/228,408 entitled: Efficient Architectures for Implementing Adaptive Algorithms, filed Aug. 29, 2000 and 60/243,480, Method and System for Processing Non-Stationary Data, filed Oct. 27, 2000; each of which is incorporated herein in its entirety by reference.

STATEMENT REGARDING FEDERALLY SPONSORED RESEARCH

This invention was made with Government support under contract N00014-00-C-0068 awarded by the Office of Naval Research. The Government has certain rights in this invention. The U.S. Government has a paid-up license in this invention and the right in limited circumstances to require the patent owner to license others on reasonable terms as provided for by the terms of contract N00014-00-C-0068 awarded by the Office of Naval Research.

BACKGROUND

1. Field of the Invention

The present invention relates generally to methods and systems of processing discrete representations of data sets. More specifically, the present invention relates to methods and systems for analyzing a data set into orthogonal components related by statistical correlations. Such methods and systems can be used in recovering data of interest from observed discrete data where the observed data may include both data of interest and other data; for example, in estimating a scalar signal from vector data.

2. Background Information

1. A Note on Computational Cost.

The computational cost of a calculation is commonly estimated by counting the number of "floating point operations," or "flops." This estimate of cost is called a "flop count." For example, consider a matrix M and a column vector v, where M and v both have N rows and M has K columns. To calculate the product Mv, the total number of scalar-scalar products is NK, and the total number of scalar-scalar sums is N(K−1). Thus, the total flop count is N(2K−1), or approximately 2NK. The flop count is only an estimate of actual computational cost because other operations are required in practice (such as moving data in memory), but the flop count is a commonly accepted indicator of cost. One reference defining flop counts is G. H. Golub and C. F. Van Loan, *Matrix Computations*, 3$^{rd}$ edition, Johns Hopkins University Press, 1996 (esp. pp. 18–19), with examples tabulated on pp. 254, 263, and 270.

A flop count is commonly estimated in turn by a simple formula for the "order of growth" that estimates how the count grows with the amount of data to be processed. In the example above, the flop count grows with order O(NK), where the notation "O( )" stands for the "order." The expression O(NK) omits the factor of two because "O( )" describes a rule for growth or scaling with increasing amounts of data input. In this context, the factor of two is a negligible detail compared to the linear growth with N and K. One reference defining "order of growth" is Harold Abelson and Gerald Sussman, *Structure and Interpretation of Computer Programs*, MIT Press and McGraw Hill, pp. 39–40.

In this context, we hope to avoid computational methods that grow with N as O(N$^3$) in favor of discovering methods that might grow as O(N$^2$) or O(N).

2. An Exemplary Problem Domain.

The exemplary problem domain presented in this application is adaptive signal processing for a set of discrete data samples. This application discloses preferred embodiments of the present invention in the context of that domain. A general block diagram of interest is shown in FIG. 1. In that figure, a filter operates on a set of scalar inputs $d_0(k)$ and a set of vector inputs $x_0(k)$ to give a set of scalar outputs $\epsilon_0(k)$. Together, the scalar inputs and vector inputs characterize the input data. The integer index k indicates that the data consists of discrete samples. The filter weights $w_0$ are chosen to optimize some performance measure; for example, minimizing a cost function, or maximizing some other measure, like a signal-to-noise ratio. As one example, when the filter weights are chosen to minimize a quadratic cost function, the filter is known as a "Wiener" or "least squares" filter [See Simon Haykin, *Adaptive Filter Theory*, 3$^{rd}$ edition, esp. pp. 194, 483, Prentice-Hall]. Here we use the term Wiener filter.

As a more specific example, FIG. 2 shows a Wiener filter processing a set of discrete data input samples x(k) to find the part of the data that best matches a steering vector s (also called a replica vector or a focusing vector). For example, in single-frequency adaptive beamforming, s can be a model of the spatial pattern a signal can trace over the antenna array; s typically being complex. For wireless communications, s can be the spreading code of an individual user in a Code Division Multiple Access (CDMA) system. For space-time adaptive processing (STAP) applications, s can be a pattern in time and space (being transformed to frequency and angle). To describe all of these applications with a common notation, we choose to normalize the steering vector to be dimensionless with unit norm $$\|s\|=(s^H s)^{1/2}=1. \qquad (1)$$

In any of these applications, the blocking matrix B finds the part of x(k) orthogonal to s. Thus, $d_0(k)=s^H x(k)$ identifies the part of the data in the direction of s, and $x_0(k)=B x(k)$ is the rest of the data orthogonal to s.

Here we show how the filter in FIG. 2 applies to a block of data vectors shown in FIG. 3. Let x(k) be a column vector of observed data with N entries. The observed data may be complex. The index k means that x(k) is one data vector in a block of data vectors, where $1 \leq k \leq K$. Increasing k typically corresponds to increasing time. Let the block of data vectors be the N-by-K matrix $$X \equiv [x(1), x(2), \ldots, x(k), \ldots, x(K)]. \qquad (2)$$

In this example, the objective is to filter X to extract the part of the observed data that best matches a steering vector or replica vector s.

3. Approaches to Retrieving Data of Interest from Observed Data.

Non-adaptive Approaches

A simple approach to retrieve the data of interest is to multiply the input data vectors onto the steering vector s, so the result of the filtering would be the product $s^H X$. A generalization of this approach is to define a weight vector w that is some function of the steering vector s, and the result of the filtering would be the product $w^H X$. For example, w might be a copy of s with "tapering" applied to reduce sidelobes. This type of filtering is called "non-adaptive" because the weight vector w does not depend on the data X. When used in beamforming, this approach is called conventional beamforming. When used in some other applications (like CDMA), it is called matched filtering.

Data-Adaptive Approaches Generally

A more sophisticated approach to retrieving the data of interest is to calculate a weight vector w that depends on the steering vector s and the data being processed X. The result of the filtering would be the product $w^H X$, and this type of filtering is called "data-adaptive" or "adaptive" because the weight vector w depends on the data X. Many adaptive methods exist. One survey book is the one by Simon Haykin, *Adaptive Filter Theory*, $3^{rd}$ edition, Prentice-Hall; 1996; another survey book is *Adaptive Signal Processing* by Bernard Widrow and Samuel Stearns, Prentice Hall, 1985. This approach customizes the filtering for that set of data vectors.

To define an "optimal" weight vector w, an adaptive approach defines a "performance function" and then finds the weight vector that optimizes the performance function. Perhaps the most common performance functions are quadratic or energy-like cost functions to be minimized, although other performance functions are possible, and the invention described here is not restricted to any particular choice of a performance function The Minimum Variance Distortionless Response (MVDR).

One example of a simple and popular adaptive approach to retrieve data of interest from a discrete observed data set X is to solve for the Minimum Variance Distortionless Response (MVDR). In this approach the data vectors x(k) are multiplied onto a weight vector w that minimizes a quadratic cost function, e.g., an energy-like cost function, subject to the constraint that the weight vector w should pass the data that matches a replica vector s. As used herein, preferred embodiments of the present invention use averages that are "block-averages" over finite sets of K things (not ensemble averages), i.e., $$\langle \ \rangle_K \equiv \frac{1}{K} \sum_{k=1}^{K}. \quad (3)$$

The minimization is written with the constraint $w^H s=1$ as $$\min_{w^H s=1} \langle |w^H x(k)|^2 \rangle_K. \quad (4)$$

4. A Traditional Adaptive Filter Approach to Solving for the MVDR

A traditional approach to solving for the MVDR formulates the solution in terms of a data correlation or covariance matrix $$R = \langle x(k)x^H(k) \rangle_K = XX^H/K. \quad (5)$$

Using R, the minimization (4) can be rewritten $$\min_{w^H s=1} (w^H R w). \quad (6)$$

The traditional approach assumes that R has full rank (so R has an inverse, i.e., $R^{-1}$). The traditional solution of (4) or (6) is $$w_{Traditional} = R^{-1}s/(s^H R^{-1}s). \quad (7)$$

To calculate R, evaluating (5) for one block would require on the order of N-squared times K multiplication operations, or in shorthand, $O(N^2K)$. Calculating the matrices for the total number of data vectors T would cost $O(N^2T)$ operations. To calculate $R^{-1}$, the matrix inversion for one block would cost $O(N^3)$ operations, and for the total number of data vectors T, the inversions would cost $O(N^3T/K)$ operations. To multiply s onto $R^{-1}$ for each block would cost $O(N^2)$ operations, and for the total number of data vectors T, it would cost $O(N^2T/K)$ operations. Thus, the tradition approach involves costs on the order of $O(N^2)$ and $O(N^3)$, which in many practical applications is an onerous processing load for systems where N is large.

5. The Multistage Wiener Filter (MWF) Solution for the MVDR

The Multistage Wiener Filter is a data-adaptive filter that can be used for signal detection, estimation, and classification. For example, when used with a steering vectors, an MWF can process a stream of one or more blocks of data vectors x(k) to estimate how much the data resembles a replica vector s. In more sophisticated applications, an MWF can satisfy multiple constraints (where a single steering vector s may be replaced by a matrix of steering vectors).

J. S. Goldstein, I. S. Reed, and L. L. Scharf present a Wiener filter structure using multistage decomposition in "A multistage representation of the Wiener filter based on orthogonal projections," *IEEE Transactions on Information Theory*, vol. 44, no. 7, pp. 2943–2959, November 1998 [GOLDSTEIN], incorporated herein by reference in its entirety. [GOLDSTEIN] presents a generalized sidelobe canceller (GSC) MDVR-constrained Wiener filter and a method for implementing such a filter as an MWF. An example of such a filter with two stages is shown in FIG. 2.

The MWF described in [GOLDSTEIN] provides an MVDR solution with advantages over the traditional MVDR solution shown here in Equation 7, e.g., the MWF works in situations where R does not have an inverse. For the special case where the data are stationary and the MWF is calculated to full rank, it gives the same performance as traditional solutions for the MVDR based on a data covariance matrix.

More typically, real-world applications such as:
  Wireless communications—where users are turning transceivers on and off;
  Passive beamforming—when wave sources are moving with respect to the receiver; and
  Active radar and sonar—when clutter statistics vary with range along the ground or ocean floor;

present non-stationary data. In the face of such nonstationary data, the MWF may perform better than traditional solutions that are based on a data covariance matrix inversion. When the MWF is calculated with reduced rank, it may outperform traditional the MVDR solution when the sample support is low. The MWF is based on statistics that represent interference more directly and efficiently than a covariance matrix. MWF filters have been investigated in simulations for wireless communications and have been tested with real radar data. In each case, technical performance can equal or exceed that of previous methods.

However, as indicated in FIG. 2, the [GOLDSTEIN] MWF calls for calculation of the matrix product between a blocking matrix B and the data x(k) to find the data orthogonal to s. When calculated explicitly, the matrix multiplication Bx(k) incurs a cost of $O(N^2K)$ for a block $1 \leq k \leq K$. The subsequent adaptive stages involve more blocking matrices $B_i$ to find the data orthogonal to the correlation direction vectors $h_i$. Each stage incurs a cost of $O(N^2K)$.

It would be desirable to implement orthogonal decomposition without the explicit use of blocking matrices.

SUMMARY OF THE INVENTION

A method for analyzing data, the data characterized by a set of scalars and a set of vectors, to analyze the data into components related by statistical correlations. In preferred embodiments, the invention includes steps or devices for, receiving a set of a scalars and a set of vectors as the inputs; calculating a correlation direction vector associated with the scalar and vector inputs; calculating the inner products of the input vectors with the correlation direction vector; multiplying the inner products onto the correlation direction vector to form a set of scaled correlation vectors; and subtracting the scaled correlation vectors from the input vectors to find the projections of the input vectors orthogonal or substantially orthogonal to the correlation direction vector. The outputs are the set of scalar inner products and the set of vectors orthogonal or substantially orthogonal to the correlation vector. The steps or devices can be repeated in cascade to form a multi-stage analysis of the data. The invention can also be used with a steering vector preceding the adaptive analysis stages. In preferred embodiments, the invention requires less computational resources than existing methods.

A preferred embodiment described herein concerns the method for analyzing the data to obtain a basis for calculating an optimal solution to a signal processing problem. Traditionally, a popular approach has been to calculate a data-averaged covariance matrix and then to analyze the matrix into eigenvalues and eigenvectors. A more recent approach is the multi-stage decomposition of the data into orthogonal components identified by the basis of statistical correlations. The invention here applies to the latter approach of multi-stage decompositions identified by statistical correlations.

DESCRIPTION OF THE SEVERAL VIEWS OF THE DRAWING(S)

DETAILED DESCRIPTION OF THE INVENTION

Generally

Figure 4:
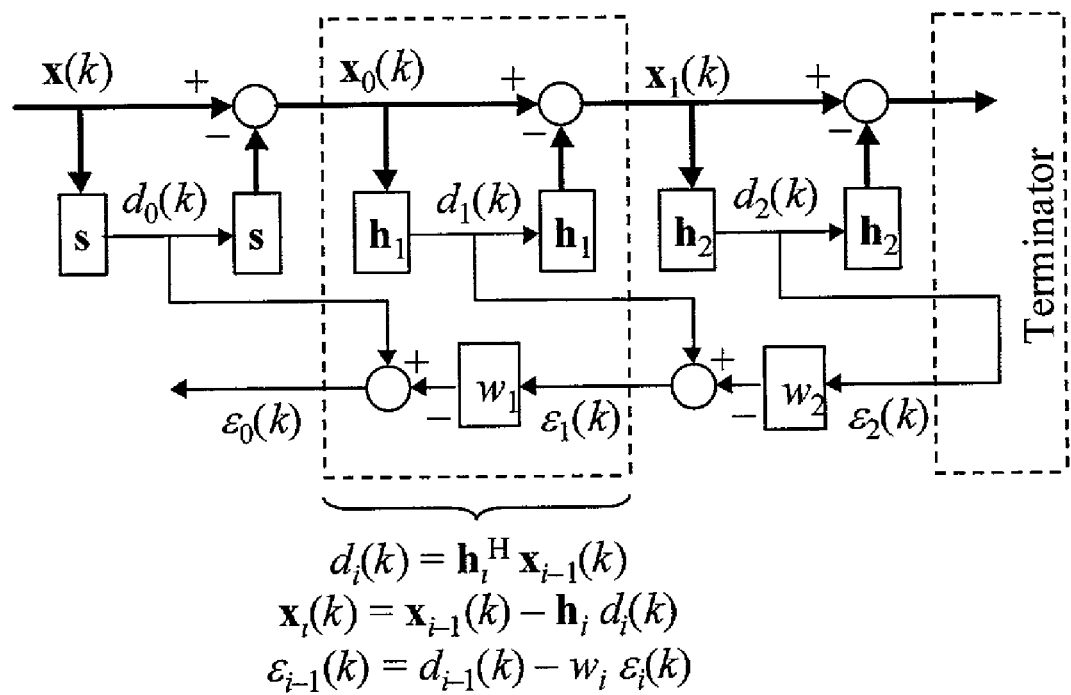
FIG. 4 is a schematic diagram of a preferred embodiment of the present invention.

FIG. 4 schematically illustrates a preferred embodiment of the present invention. The upper chain analyzes the data (flowing from left to right). The lower chain synthesizes the filter weights and the filter output (flowing from right to left).

In the example using a steering vector s, processing begins with non-adaptive calculations. First, the data vectors are projected onto the steering vector to form an initial estimate of the desired signal $$d_0(k) = s^H x(k). \tag{8}$$

For example, $d_0(k)$ may be the output of a conventional beamformer or a matched filter. In general, $d_0(k)$ contains interference that comes in through the sidelobes of s. To prepare for a statistical analysis that will identify and subtract this interference, the rest of the data may be isolated by writing $$x_0(k) = Bx(k), \tag{9}$$

where B is a "blocking matrix" that finds the projection of the data orthogonal to s, i.e., the projection onto the nullspace of s.

The projection operation in (9) is uniquely defined. However, the projection can be accounted for in at least two ways. In earlier approaches, including those described in [GOLDSTEIN], the blocking matrix was rectangular to account for the result being an N−1 dimensional vector (i.e., a vector with length N−1). The other possibility is to consider the square blocking matrix $$B = I - ss^H. \tag{10}$$

The square matrix accounts for the same projection, but the projection may be viewed as a subtraction in the fixed perspective of the original N-dimensional coordinate system (i.e., where all vectors have length N)

The choice between these two blocking matrices is relevant to the numerical efficiency realized in the present invention. By choosing the square blocking matrix in (10) in preferred embodiments of the present invention, we can re-write (9) as $$x_0(k) = [I - ss^H]x(k) = x(k) - sd_0(k)$$

By accounting for the projection in preferred embodiments of the present invention with the subtraction shown in (11), the computational cost for a block is $O(NK)$. This gives us a significant savings over the matrix multiplication shown in (9), which would cost $O(N^2K)$.

Given $d_0(k)$ and $x_0(k)$ as inputs, the processing continues with a recursion of adaptive stages. The index i identifies the adaptive stage number (where i=1 is the first adaptive stage, and so on). To support stage i, we calculate the block-averaged correlation between the two inputs to that stage $$r_{i-1} = <x_{i-1}(k)d_{i-1}^*(k)>_K. \tag{12}$$

Stage i will use this correlation in terms of the correlation magnitude $\delta_i$ and the correlation direction vector $h_i$ $$\delta_i = \|r_{i-1}\| = (r_{i-1}^H r_{i-1})^{1/2}, \tag{13}$$

$$h_i = r_{i-1} / \|r_{i-1}\|. \tag{14}$$

While preferred embodiments of the present invention calculate the correlation direction vector by using block averaging with uniform weighting over the block, other averaging techniques known to those skilled in the art may be used, based on the requirement of the particular application (e.g., time constraints, accuracy requirements) and the availability of processing resources To find the projections of the data along this direction and orthogonal to this direction, recalling the numerical efficiency achieved in (11), preferred embodiments of the present invention account for this projection as a subtraction, $$d_i(k)=h_i^H x_{i-1}(k) \tag{15}$$

$$x_i(k)=[I-h_i h_i^H]x_{i-1}(k)=x_{i-1}(k)-h_i d_i(k). \tag{16}$$

This recursive analysis may be terminated in several ways. If the block of data X has full rank, then the projections may continue until all the data is projected onto a set of orthogonal unit vectors $[s, h_1, h_2, \ldots, h_{N-1}]$. This analysis would use N−1 stages (because s accounted for one direction already). Or, if the block of data X is not full rank (for example, if we intentionally choose K<N), then the rank of the data will gracefully "underflow" in the analysis. In that case, $x_i(k)$ would contain only zeros for the highest stages. Alternatively, the filtering may be intentionally truncated to some smaller number of stages we will call S (where $1 \leq S \leq N-1$). Truncation is shown graphically in FIG. 2 with the "terminator" that sets $\epsilon_S(k)=d_S(k)$.

After the analysis is finished, the initialization $\epsilon_S(k)=d_S(k)$ begins the synthesis along the lower chain of FIG. 4 from right to left. The synthesis is recursive. For each adaptive stage i (from i=S to i=1), we calculate $$\xi_i = \langle |\epsilon_i(k)|^2 \rangle_K \tag{17}$$

$$w_i = \delta_i/\xi_i \tag{18}$$

$$\epsilon_{i-1}(k)=d_{i-1}(k)-w_i \epsilon_i(k) \tag{19}$$

The result is the scalar output $\epsilon_0(k)$.

To facilitate further understanding of the present invention, in comparison to other filters that use weight vectors explicitly, the following observation is disclosed. Note that the synthesis of $\epsilon_0(k)$ can be written as $$\epsilon_0(k) = d_0(k) - w_1[d_1(k) - w_2[d_2(k) - w_3[d_3(k) - \cdots ]]] \tag{20}$$
$$= d_0(k) - w_1 d_1(k) + w_1 w_2 d_2(k) - w_1 w_2 w_3 d_3(k) + \cdots .$$

Further, when the orthogonal vectors $[s, h_1, h_2, h_3, \ldots]$ all have N entries (as is the case in preferred embodiments described herein), the dependence on x(k) can be written directly as $$\epsilon_0(k)=[s^H - w_1 h_1^H + w_1 w_2 h_2^H - w_1 w_2 w_3 h_3^H + \ldots ]x(k). \tag{21}$$

This identifies an equivalent weight vector for the Multistage Wiener Filter $$w_{WMF} \equiv s - w_1 h_1 + w_1 w_2 h_2 - w_1 w_2 w_3 h_3 + \ldots \tag{22}$$

Figure 1:
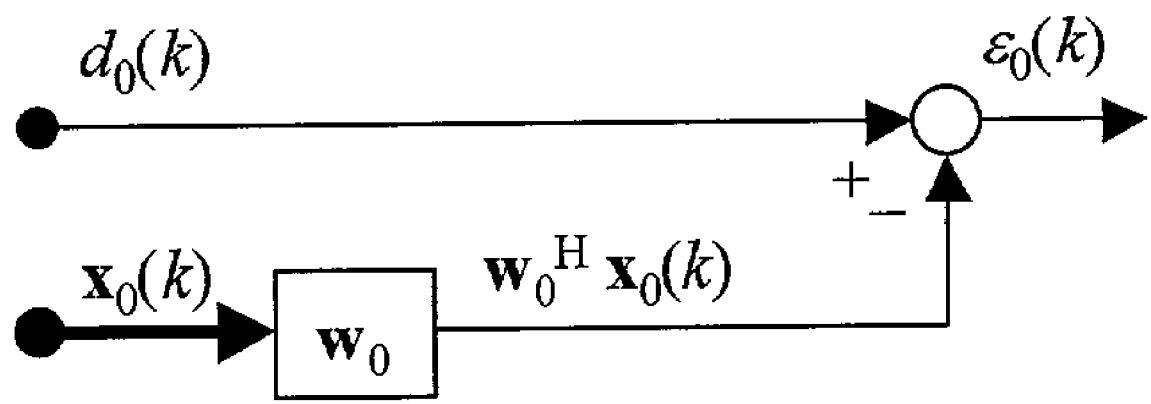
FIG. 1 is an illustrative embodiment of the general processor of interest.
Figure 2:
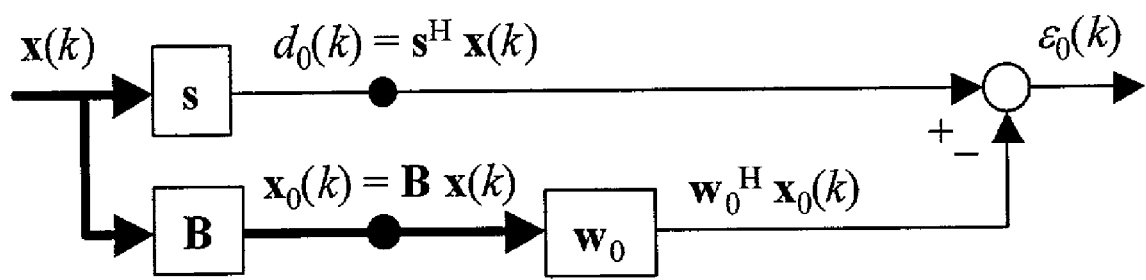
FIG. 2 is an example of the processor used as a generalized sidelobe canceller (GSC) for determining the minimum variance distortionless response (MVDR).

In some applications, we need not implement this weight vector numerically because we have direct access to the filter output $\epsilon_0(k)$ shown in FIG. 2. In other applications, the weight vector may be a useful result.

Figure 5:
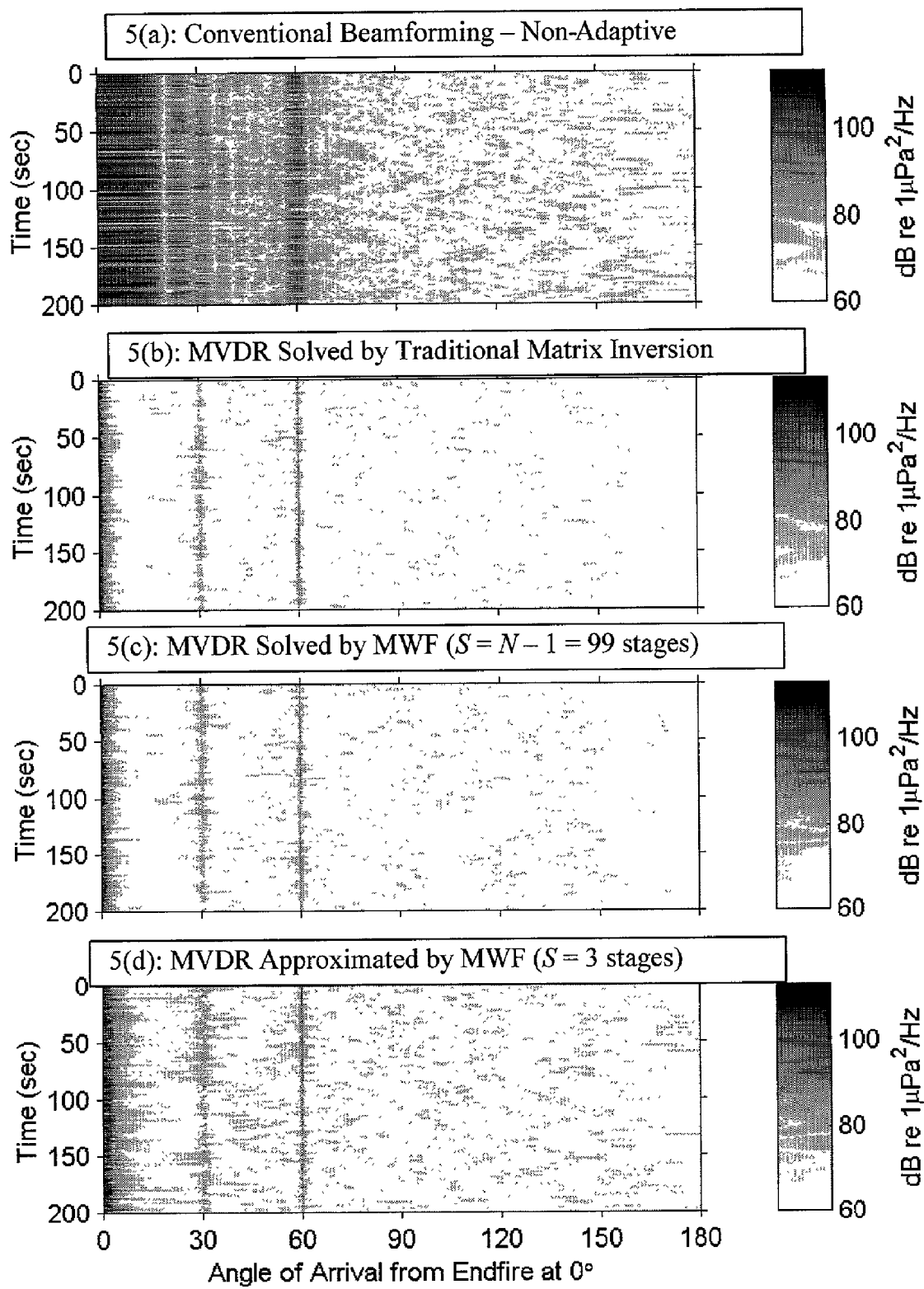
FIG. 5 is a series of plots illustrating an example of the present invention applied to single-frequency adaptive beamforming.

As an example of a preferred embodiment of the present invention, FIG. 5 shows a simulation of an underwater acoustics problem. A horizontal line array with N=100 elements is resolving three spatially discrete sources of sound in a background of noise. The discrete sources and the noise are all computed as pseudorandom complex Gaussian variables to represent the contents of a single fast Fourier transform (FFT) frequency bin. The data vectors are collected once every second. The units in the figure are dB re 1 µPa²/Hz to represent the units of a frequency bin in a passive sonar problem (where a frequency spectrum integrates to give a variance in µPa²). At the element level, the ambient acoustic noise level is 65 dB (re 1 µPa²/Hz), and the ambient noise is isotropic to simplify this example. The frequency bin being processed is centered on a frequency that is one third of the maximum frequency that the array can process without aliasing in space, giving the isotropic ambient noise some correlation between elements. Uncorrelated element noise is also modeled with an effective level of 25 dB (re 1 µPa²/Hz). The three spatially discrete sources are modeled here as locally plane waves with arrival angles of 0°, 30°, and 60° from endfire respectively. Their RMS amplitudes at the element level are 85, 65, and 75 dB respectively (re 1 µPa²/Hz). The beamforming is calculated for a range of steering angles $0 \leq \phi \leq 180°$ by increments of $\Delta\phi=0.25°$. (This very fine resolution is used here so the narrow peaks will register their peak levels properly in the TIFF graphic output.) The results are shown for a single block of K=200 data vectors (covering 200 seconds).

FIG. 5(a) shows the result of conventional beamforming (CBF) as a reference for the amplitudes and the angular resolution. For CBF, the fixed weight vector here is the steering vector without tapering ($w_{CBF}=s$). To calculate the real output shown, the complex data vectors x(k) are multiplied onto the weight vector to give a power-like quantity with units of µPa²/Hz $$P_{CBF}(\phi, k) = |w_{CBF}^H(\phi)x(k)|^2. \tag{23}$$

The cost for K=200 data vectors is O(NK) for each steering angle. The figure plots $10 \log_{10}[P_{CBF}/(1 \, \mu Pa^2/Hz)]$ to show units of dB re 1 µPa²/Hz.

FIG. 5(b) shows the traditional adaptive solution computed by the matrix inversion in (7). The matrix R is computed for the entire block of K=200 data vectors at a cost of O(N²K), and the inversion is computed at a cost of O(N³). For each steering angle, an adaptive weight vector $w_{Traditional}$ is computed for the entire block by (7), and then the data vectors are multiplied onto the weight vector to calculate a power-like quantity $$P_{Traditional}(\phi,k)=|w_{Traditional}^H(\phi)x(k)|^2 \tag{24}$$

FIG. 5(c) shows the MWF solution computed with full rank (S=N−1 stages), where the computational cost is O(N²K) for each steering angle. As the plot shows, the full-rank MWF recovers the traditional solution. We could calculate the power-like output with the weight vector in (22), but instead we calculate it most efficiently from the scalar output $\epsilon_0(k)$ as $$P_{MWF}(\phi,k)=|\epsilon_0(k)|^2. \tag{25}$$

FIG. 5(d) shows the MWF solution computed with reduced rank (S=3 stages), where the computational cost is O(NKS) for each steering angle. This is a remarkable result. The super-resolution of adaptive beamforming is achieved with a computational cost comparable to conventional beamforming.

Figure 6:
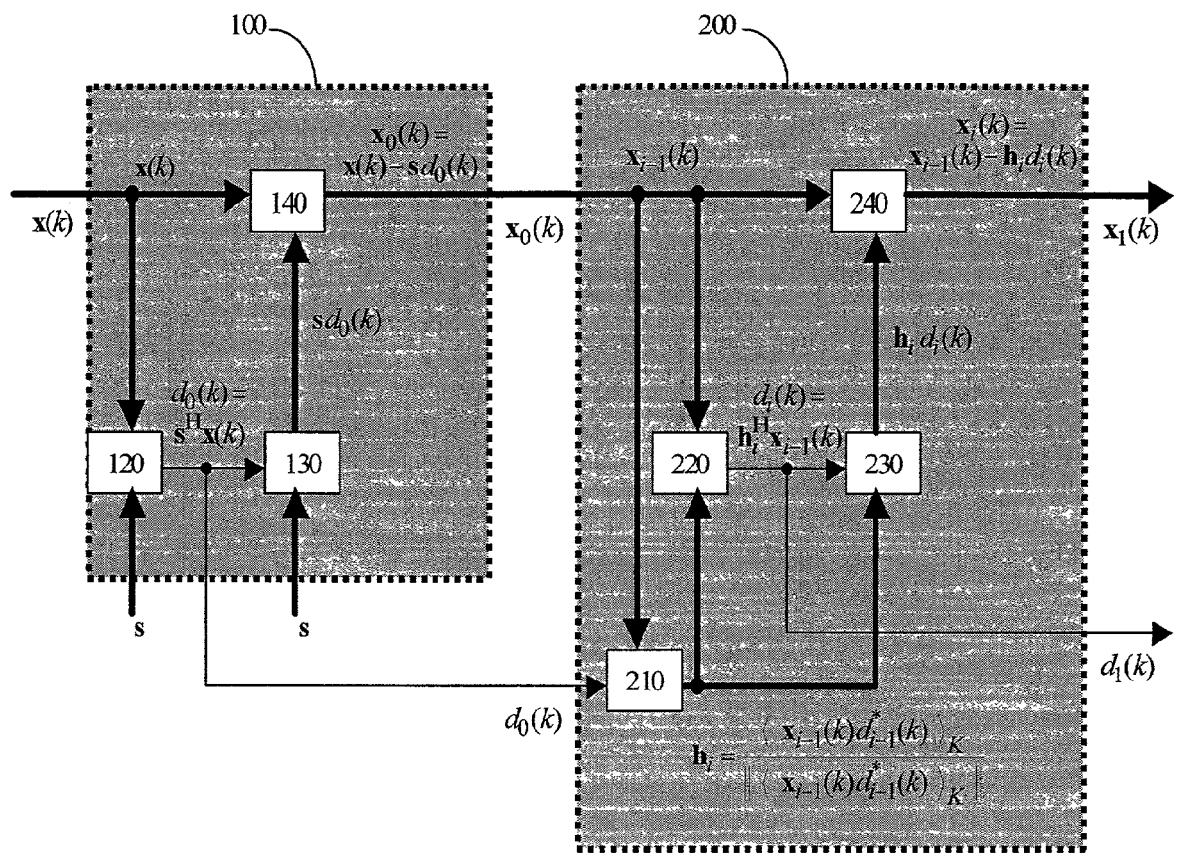
FIG. 6 is a schematic diagram of an analysis chain device in accordance with the present invention.

FIG. 6 schematically illustrates an analysis chain in the manner of the present invention. This illustrative embodiment includes one non-adaptive stage 100 and one adaptive stage 200. Subsequent adaptive stages can be added after the first adaptive stage 200, as contemplated in this example by the use of the descriptor "prior stage." The notation used in 200 represents the first adaptive stage. The index i will be used in the following description to indicate the stage, where i=0 corresponds to the non-adaptive stage, which is the "prior stage" to the i=1 adaptive stage.

The non-adaptive analysis stage 100 includes an inner product logic device 120 which receives a set of data vectors x(k) and a steering vector s as inputs, and forms a set of inner products $d_0(k)$ of each data vector x(k) with the steering vector s, i.e. $d_0(k)=s^H x(k)$. A vector scaling logic device 130, in communication with the logic device 120, receives the set of projections $d_0(k)$ and the steering vector s, to form a set of vectors, all parallel to s, but scaled by $d_0(k)$, i.e., $sd_0(k)$. A vector subtraction logic device 140, in communication with logic device 130, and operative to receive the set of data vectors x(k) and the set of scaled vectors $sd_0(k)$, is used to form a set of vector differences $x_0(k)=x(k)-sd_0(k)$ corresponding to the projection of x(k) onto the nullspace of s.

Each adaptive analysis stage 200 receives its inputs being a set of vectors $x_{i-1}(k)$ and a set of scalars $d_{i-1}(k)$ from the immediately prior stage. A correlation direction logic device 210 calculates the correlation between these inputs and normalizes the correlation direction vector $h_i$ to have unit norm $$h_i = \left( \frac{\langle x_{i-1}(k) d_{i-1}^*(k) \rangle_K}{\|\langle x_{i-1}(k) d_{i-1}^*(k) \rangle_K\|} \right)$$

While preferred embodiments of the present invention calculate the correlation direction vector by using block averaging with uniform weighting over the block, other averaging techniques known to those skilled in the art may be used, based on the requirement of the particular application (e.g., time constraints, accuracy requirements) and the availability of processing resources.

An inner product logic device 220, similar in operation to the logic device 120, is in communication with the immediately prior stage and logic device 210 of the current stage. Logic device 220 is operative to receive the set of vector inputs $x_{i-1}(k)$, and the correlation direction vector $h_i$ of the current adaptive stage, and to form a set of inner products $d_i(k)$ of each input vector $x_{i-1}(k)$ with the correlation direction vector, i.e., $d_i(k)=h_i^H x_{i-1}(k)$. A vector scaling logic device 230, in communication with the logic devices 210 and 220 of the current stage, is operative to receive the set of current stage projections $d_i(k)$, and the correlation direction vector of the current stage $h_i$, and to form a set of vectors, all parallel to $h_i$, but scaled by $d_i(k)$, i.e., $h_i d_i(k)$.

A vector subtraction logic device 240, similar in operation to the logic device 140, is operative to receive the set of input vectors $x_{i-1}(k)$ and the set of scaled vectors $h_i d_i(k)$, is used to form a set of vector differences $x_i(k)=x_{i-1}(k)-h_i d_i(k)$ corresponding to the orthogonal projection of $x_{i-1}(k)$ orthogonal to $h_i$.

In preferred embodiments of the present invention, the computational costs of the MWF are insensitive to the choice of K dividing the total number of data vectors T into smaller blocks. In contrast, with the traditional matrix inversion, choosing smaller K would cause the cost to rise because there would be more matrices to invert for a given T.

Figure 3:
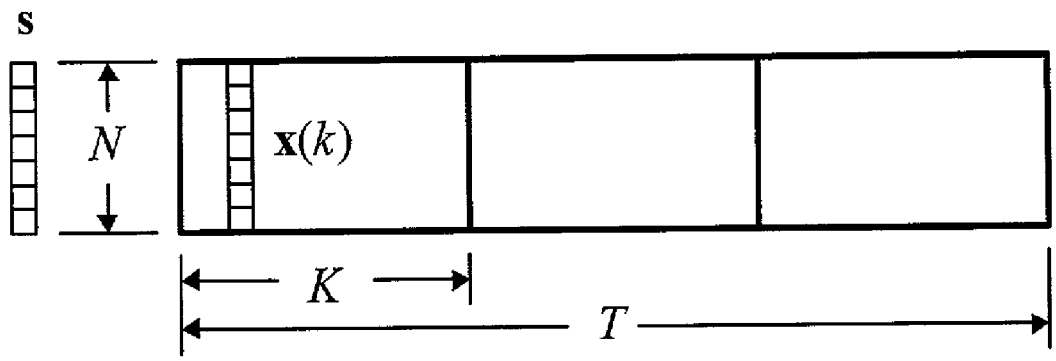
FIG. 3 is a schematic diagram of the data to be processed by the filter in FIG. 2.

In preferred embodiments, the present invention provides graceful degradation of performance when the input data has bad channels or data samples. While still using the implementation of FIG. 3, the "bad" channels or samples can be padded with zeros and the steering vector s can be reprogrammed to have zeros there and have unit norm ($s^H s=1$). The zeros will flow through the invention without being involved. If this makes the block of data X rank-deficient, the filter will handle the "underflow" of rank gracefully if the denominators in $w_i=\delta_i/\xi_i$ are given small non-zero numerical values to avoid division by zero. This modification adds no significant computational expense.

Graceful "underflow" of rank in this manner also facilitates the processing of rank-deficient blocks caused by intentionally choosing the number of data vectors K to be less than the number of sensors N. The number of sensors N corresponds to the number of dimensions in the original coordinate system. In such cases (K<N), the minimization in (4) or (6) is indeterminate (having more unknowns in w than equations to determine them). This allows w to have extra degrees of freedom that do not affect the cost function in (4) or (6). In such cases, the MWF finds the minimum norm weight vector $\min(\|w\|)$ that solves the MVDR or "least squares" problem stated in (4) and (6).

Efficient implementation of the adaptive filter allows for trade-off between performance (e.g., bit error rate in wireless communications, decibels of gain in adaptive beamformers) and cost (money or other resources such as weight, space, power, memory, FLOPS). Whether the method is used to improve cost or performance depends on the designer making a choice about how the technical superiority should be spent.

For example, in wireless communications, suppose that the manufacturing cost of a single cell phone would not increase by incorporating the present invention in the phone. A system designer could choose to make performance for each user better (for a given number of users on a system) or the designer could choose to put more users on the system (holding performance at present levels, but lowering cost per user to install and operate the system).

Summary

In summary, while the subspace projection used in an adaptive filter may be formulated as a multiplication onto a blocking matrix, an efficient numerical realization of a projection should be implemented as a subtraction in the fixed perspective of the original N-dimensional space. Maintaining the fixed perspective reduces the computational requirements.

Note that this disclosure of preferred embodiments of the current invention does not rely on assumptions of stationarity or Gaussianity for the interference being suppressed. The only such assumptions were made for convenience in the generation of the simulated data and the choice of a fixed steering vector s. All of the equations written in this disclosure describe the minimization of the quadratic cost function for the blocks of data shown in FIG. 3. No assumptions were made about the source or the makeup of the data block X.

The invention claimed is:

1. An analysis chain for a multistage adaptive filter, the analysis chain comprising:
   a non-adaptive analysis stage, comprising:
      a first inner product logic device operative:
         to receive a set of data vectors and a steering vector, and
         to form a first set of inner products of the steering vector and each data vector, and
      a first vector scaling logic device:
         in communication with the first inner product logic device, and
         operative:

to receive the steering vector and the first set of inner products, and to form a first set of scaled direction vectors of the steering vector and each inner product of the first set of inner products, and a first vector difference logic device:

in communication with the first vector scaling logic device, and operative:

to receive the set of data vectors and the first set of scaled vectors, and to form a first set of vector differences between corresponding elements of the set of data vectors and the first set of scaled vectors; and at least one adaptive analysis stage comprising:

a correlation direction vector logic device:

in communication with the immediately prior stage, and operative:

to receive a set of vector differences of the immediately prior stage and a set of inner products of the immediately prior stage, and to form a current stage correlation direction vector between the vector differences of the immediately prior stage and the corresponding inner products of the immediately prior stage; and an adaptive stage inner product logic device:

in communication with the immediately prior stage and the adaptive stage correlation direction vector logic device of the current stage, and operative:

to receive the set of vector differences of the immediately prior stage and the current stage correlation direction vector, and to form a current stage set of inner products of each vector difference of the immediately prior stage and the current stage correlation direction vector; and an adaptive stage vector scaling logic device:

in communication with the correlation direction vector logic device of the current stage and the inner product device of the current stage, and operative:

to receive the set of inner products of the current stage and the correlation direction vector of the current stage, and to form a current stage set of scaled direction vectors of each inner product of the set of inner products of the current stage and the correlation direction vector of the current stage; and an adaptive stage vector difference logic device:

in communication with the vector difference logic device of the immediately prior stage and the vector scaling logic device of the current stage, and operative:

to receive the set of vector differences of the immediately prior stage and the set of scaled vectors of the current stage, and to form a current stage set of vector differences between corresponding elements of the set of vector differences of the immediately prior stage and the set of scaled direction vectors of the current stage.

2. An adaptive stage of an analysis chain for a multistage adaptive filter, the adaptive stage comprising:

a correlation direction vector logic device:

in communication with the immediately prior stage, and operative:

to receive a set of vector differences of the immediately prior stage and a set of inner products of the immediately prior stage, and to form a current stage correlation direction vector between the vector differences of the immediately prior stage and the corresponding inner products of the immediately prior stage; and an adaptive stage inner product logic device:

in communication with the immediately prior stage and the adaptive stage correlation direction vector logic device of the current stage, and operative:

to receive the set of vector differences of the immediately prior stage and the current stage correlation direction vector, and to form a current stage set of inner products of each vector difference of the immediately prior stage and the current stage correlation direction vector; and an adaptive stage vector scaling logic device:

in communication with the correlation direction vector logic device of the current stage and the inner product device of the current stage, and operative:

to receive the set of inner products of the current stage and the correlation direction vector of the current stage, and to form a current stage set of scaled direction vectors of each inner product of the set of inner products of the current stage and the correlation direction vector of the current stage; and an adaptive stage vector difference logic device:

in communication with the vector difference logic device of the immediately prior stage and the vector scaling logic device of the current stage, and operative:

to receive the set of vector differences of the immediately prior stage and the set of scaled vectors of the current stage, and to form a current stage set of vector differences between corresponding elements of the set of vector differences of the immediately prior stage and the set of scaled direction vectors of the current stage.

3. An adaptive filter comprising:

a plurality of stages, at least one stage comprising an adaptive analysis portion;

at least one adaptive analysis portion of at least one stage comprising:

a correlation direction vector device operative to form a correlation direction vector between a set of input vectors and a set of input scalars, each input set discretely characterized on the same index;

an inner product device operative to form a set of inner products of each input vector and the correlation direction vector;

a vector scaling device operative to form a set of scaled direction vectors from each inner product and the correlation direction vector; and a vector difference device operative to form a set of vector differences between corresponding elements of the set of input vectors and the set of scaled direction vectors.

4. The adaptive filter of claim 3, wherein at least one stage comprising an analysis portion further comprises a synthesis portion:

at least one synthesis portion of at least one stage comprising an analysis portion comprising:

a mean square error device operative to form an average magnitude squared error from an error signal of the next higher stage;

a weight calculation device operative to form a weight as a function of the correlation vector length of the corresponding analysis portion and the average magnitude squared error;

an error scaling device operative to form a scaled error as a product of the error signal of the next higher and the weight; and an error difference device operative to form a error signal of the current stage as the difference between the set of input scalars and the scaled error.

* * * * *